US007268027B2

(12) United States Patent
Kwon et al.

(10) Patent No.: US 7,268,027 B2
(45) Date of Patent: Sep. 11, 2007

(54) METHOD OF MANUFACTURING PHOTORECEIVER

(75) Inventors: Young Se Kwon, Daejeon (KR); Jung Ho Cha, Daejeon (KR)

(73) Assignee: Korea Advanced Institute of Science and Technology, Daejeo (KR)

( * ) Notice: Subject to any disclaimer, the term of this patent is extended or adjusted under 35 U.S.C. 154(b) by 191 days.

(21) Appl. No.: 11/228,471

(22) Filed: Sep. 15, 2005

(65) Prior Publication Data
US 2006/0205127 A1 Sep. 14, 2006

(30) Foreign Application Priority Data
Mar. 11, 2005 (KR) .................. 10-2005-0020513

(51) Int. Cl.
  *H01L 21/84* (2006.01)
  *H01L 21/338* (2006.01)
  *H01L 21/331* (2006.01)
(52) U.S. Cl. .............. 438/172; 438/149; 438/164; 438/167; 438/343; 257/E21.047; 257/E21.051; 257/E21.053; 257/E21.064; 257/E21.092
(58) Field of Classification Search .......... 438/172, 438/149, 164, 167, 343; 257/190, 194, 471
See application file for complete search history.

(56) References Cited

U.S. PATENT DOCUMENTS

| 5,489,798 | A * | 2/1996 | Doguchi et al. ............ 257/458 |
| 5,885,847 | A * | 3/1999 | Yoon et al. .................. 438/59 |
| 6,465,289 | B1 * | 10/2002 | Streit et al. ................. 438/167 |
| 2005/0023554 | A1 * | 2/2005 | Chu et al. .................... 257/190 |

* cited by examiner

*Primary Examiner*—Scott B. Geyer
*Assistant Examiner*—Mohsen Ahmadi
(74) *Attorney, Agent, or Firm*—Graybeal Jackson Haley LLP

(57) ABSTRACT

Disclosed is a method of manufacturing a photoreceiver, including sequentially laminating a buffer layer, a channel layer, a barrier layer, and a cap layer on a substrate; forming a mesa for HEMT and MSM PD by removing the buffer layer, the channel layer, the barrier layer, and the cap layer with the exception of a region corresponding to HEMT and MSM PD; forming a source electrode and a drain electrode of HEMT; removing the cap layer from a region corresponding to a gate electrode of HEMT and a Schottky electrode of MSM PD; forming the gate electrode of HEMT and the Schottky electrode of HEMT on the cap layer-removed region; and removing the cap layer, the barrier layer and the channel layer from a region corresponding to an optical waveguide, to expose the optical waveguide.

14 Claims, 4 Drawing Sheets

METHOD OF MANUFACTURING PHOTORECEIVER

CROSS-REFERENCE TO RELATED APPLICATIONS

This application claims foreign priority benefits under 35 USC § 119 (a) to Korean Patent Application No. 2005-20513, filed 11 Mar. 2005, which is incorporated herein by reference.

BACKGROUND OF THE INVENTION

1. Field of the Invention

The present invention relates, in general, to a method of manufacturing a photoreceiver, and, more particularly, to a method of simultaneously manufacturing a high electron mobility transistor (HEMT) and a waveguide integrated metal-semiconductor-metal photodetector (MSM PD) used in a photoreceiver.

2. Description of the Related Art

While optical communication is beginning and is becoming widely supplied, thorough attempts are made to monolithically integrate a transistor and a photodiode on an InP substrate. Of various monolithic integration methods, a method of monolithically integrating an HBT (Hetero-junction Bipolar Transistor) and a p-i-n photodetector by sharing the base and the collector layer of HBT is regarded to be excellent in view of cost and efficiency. However, in an HEMT part of a thin film layer is not shared to be monolithically integrated, as in the HBT. If the thin film structure of the HEMT is changed into a shared structure to realize monolithic integration, the HEMT may have simpler processes and better surface evenness than the HBT, and thus, the HEMT monolithic integration method comes to be a better technique than the integration methods using the HBT and the p-i-n photodetector. The p-i-n photodetector is a photodiode having a structure composed of a p-region, and an n-region, and an intrinsic (i type) semiconductor layer between the p-region and the n-region.

In the HEMT structure, since a buffer functions to capture electrons in a quantum well using the potential difference of a conduction band, it is formed mainly of a larger band gap material. However, since most electrons in the HEMT are confined only in the ground state and the first excited state of the quantum well, it is good for the buffer with narrow bandgap materials if the conduction band offset of materials is high enough for constructing discrete energy levels up to the first excited state in the quantum well. That is, even if the material, which has a band gap small enough to absorb light at a wavelength of 1.3 µm for optical communication, is used for the buffer of the HEMT the conduction band minimum of this buffer is higher than the first excited state of the quantum well, therefore the electrical properties of the HEMT are not greatly changed. In addition, in InP-based semiconductors, the smaller the band gap it is, the larger the refractive index it has. Hence, as seen in FIG. 3, an optical waveguide 118 composed of a small band gap buffer, a substrate and air may be realized.

SUMMARY OF THE INVENTION

Accordingly, it is an object of the present invention to alleviate the problems in the related art and to provide a method of manufacturing a photoreceiver, in which a HEMT and a waveguide integrated MSM PD, are simultaneously integrated using a thin film structure comprising InGaAsP grown as a buffer.

In order to accomplish the above object, the present invention provides a method of manufacturing a photoreceiver, comprising: sequentially laminating a buffer layer, a channel layer, a barrier layer, and a cap layer on a substrate; forming a mesa for HEMT and MSM PD by removing the buffer layer, the channel layer, the barrier layer, and the cap layer with the exception of a region corresponding to HEMT and MSM PD; forming a source electrode and a drain electrode of HEMT; removing the cap layer from a region corresponding to a gate electrode of HEMT and a Schottky electrode of MSM PD; forming the gate electrode of HEMT and the Schottky electrode of HEMT on the cap layer-removed region; and removing the cap layer, the barrier layer and the channel layer from a region corresponding to an optical waveguide, to expose the optical waveguide.

In addition, the present invention provides a method of mounting a photoreceiver comprising HEMT and MSM PD manufactured by the method according to the above-mentioned method, the method comprising: forming an end of an optical waveguide connected to MSM PD into an inclined plane; providing a separate substrate; forming a V-groove in a portion of the separate substrate in which optical fibers are aligned; forming a [111] plane in a portion of the separate substrate, which faces an end of the V-groove obliquely; and coupling the photoreceiver to the silicon substrate, to photocouple the optical fibers to MSM PD of the photoreceiver.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Hereinafter, a detailed description will be given of the present invention, with reference to the appended drawings.

Figure 1:
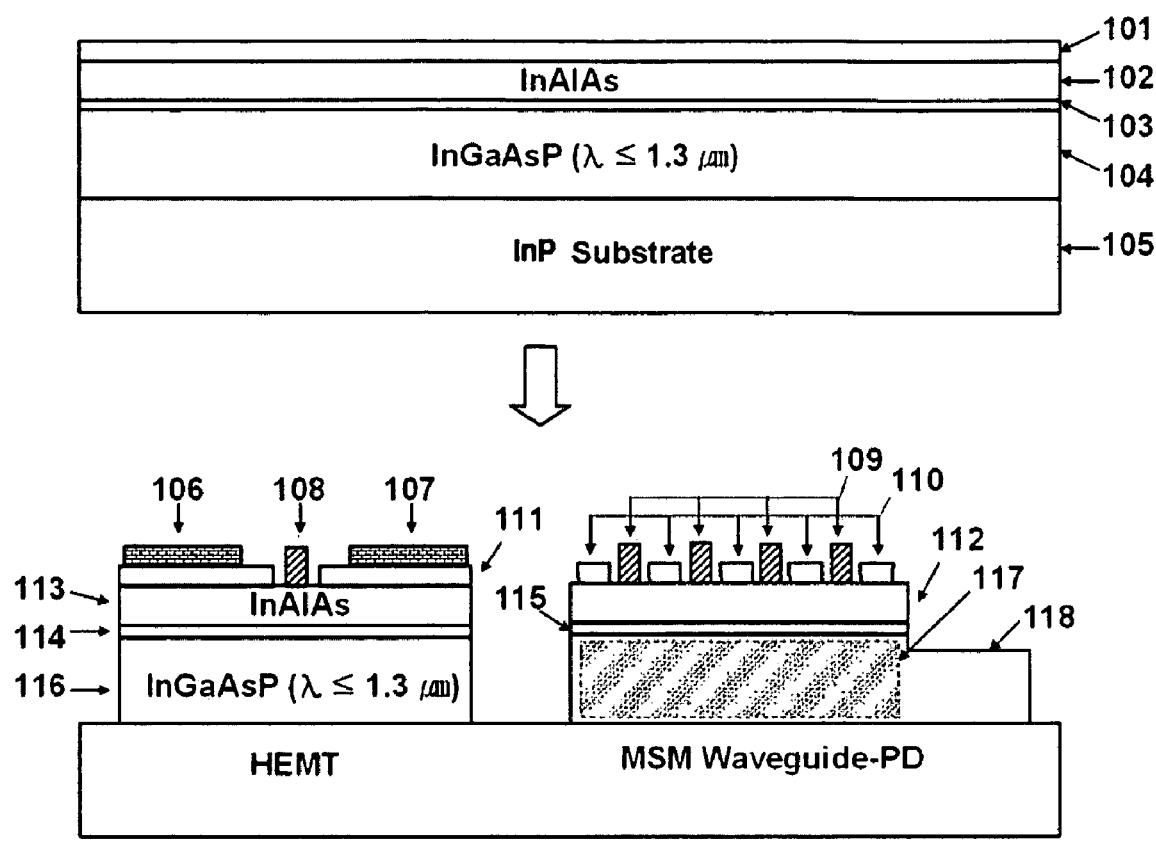
FIG. 1 is a sectional view showing the process of monolithically integrating an HEMT and a waveguide integrated MSM PD to a thin film structure comprising a quarternary compound semiconductor grown as a buffer.

FIG. 1 is a sectional view showing the process of monolithically integrating an HEMT and a waveguide integrated MSM PD to a thin film structure comprising InGaAsP grown as a buffer. The HEMT structure is consist of an $n^+$-InGaAs cap layer 101, an InAlAs barrier layer 102 having modulation doping, and an InGaAs channel layer 103 and, the HEMT and the waveguide integrated MSM PD are monolithically integrated using InGaAsP ($\lambda \leq 1.3$ µm) among quarternary compound semiconductors as a buffer layer 104, which is described below.

As shown in this drawing, thin film layers designating the $n^+$-InGaAs cap layer 101, the InAlAs barrier layer 102 having modulation doping, and the InGaAs channel layer 103 are the same as thin film layers of a generally used HEMT, in which the lattice constants of the InAlAs barrier layer 102 and the InGaAs channel layer 103 can be intended to be different from the lattice constant of the InP to increase performance of the HEMT. The buffer layer 104 is InGaAsP ($\lambda \leq 1.3$ µm) lattice matched to InP, the use of which results in monolithic integration of waveguide integrated MSM PD to the thin film structure of the HEMT. The buffer layer in the HEMT functions to form the quantum well with the channel layer, using a material having the positive conduction band offset to the channel layer, and confine a two-dimensional electron gas in an electronic quantum level of quantum well generated by quantum effects. In the case where InGaAsP ($\lambda=1.3$ µm), which has the smallest bandgap among the InGaAsP ($\lambda \leq 1.3$ µm) quarternary compound semiconductors, is used as the buffer layer, the conduction band offset of the InGaAsP ($\lambda=1.3$ µm) is higher than the first excited energy level among quantum levels of the InGaAs channel layer. As such, the energy difference amounts to 62 meV, which is at least two times the thermal energy of 26 meV at room temperature. Further, the density of electrons confined in the InGaAs channel layer is $1.407 \times 10^{12}$ cm$^{-2}$, which is similar to $1.448 \times 10^{12}$ cm$^{-2}$ of electrons confined in the InGaAs channel layer when InP is used as a buffer. This is because most two-dimensional electrons are confined in the ground state and the first excited state of the quantum well of the HEMT.

Figure 2:
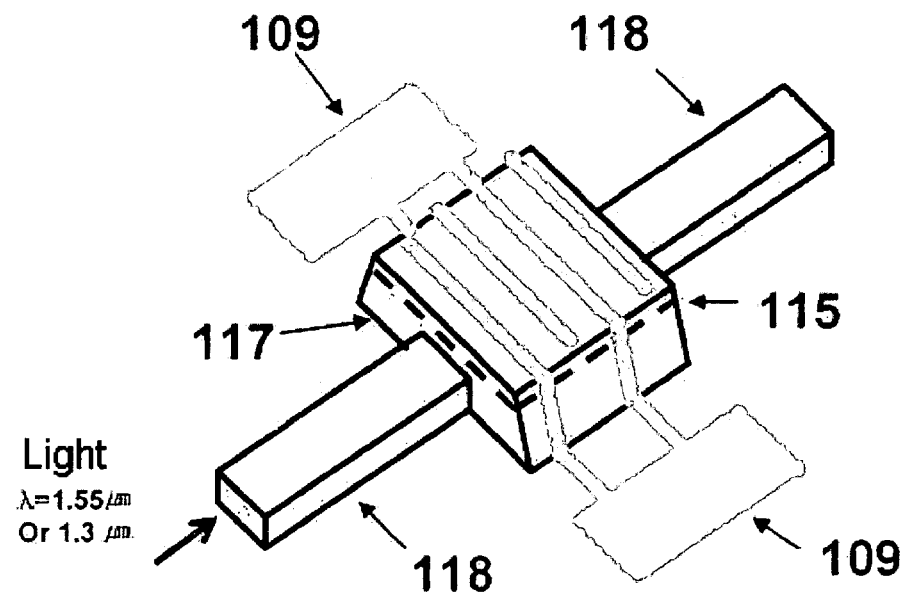
FIGS. 2 and 3 are a perspective view and a sectional view, respectively, of an optical waveguide integrated MSM PD manufactured using the quarternary compound semiconductor buffer, in particular, FIG. 3 showing a light path according to the optical waveguide.
Figure 3:
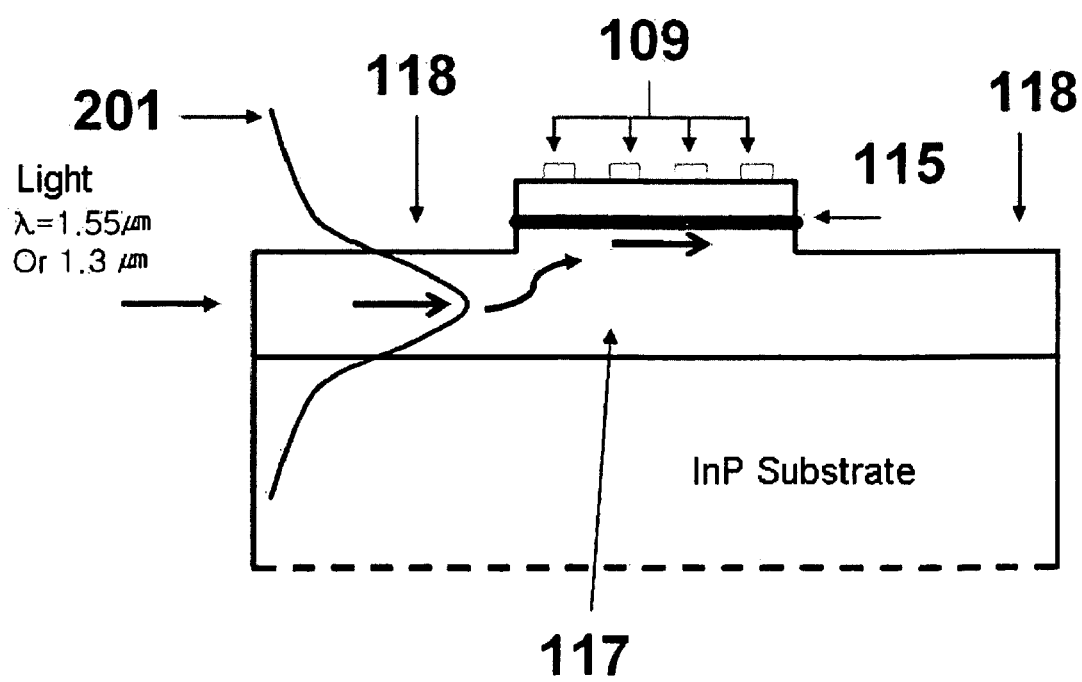

FIGS. 2 and 3 are a perspective view and a sectional view, of an optical waveguide-integrated MSM PD manufactured using the quarternary compound semiconductor buffer respectively. In particular, FIG. 3 shows a light path according to the optical waveguide 118.

As shown in these drawings, if InGaAsP ($\lambda=1.3$ µm) is not used as the buffer in the thin film structure of the HEMT shown in FIG. 1, the light illuminated perpendicular to the surface of the device can not be absorbed by the portion 117 where the buffer layer 104 is used as a buffer layer/optical waveguide layer of the MSM PD, like a general MSM PD. This is because, in the case of InGaAsP ($\lambda<1.3$ µm), the buffer layer of the portion 117 used as the buffer layer/optical waveguide layer cannot absorb light at a wavelength of 1.3 or 1.55 µm for optical communication. Thus, in the case where InGaAsP ($\lambda<1.3$ µm) is used as the buffer layer 104, the light absorbing region is the InGaAs channel layer 103 and 115, and light is illuminated parallel to the surface of the substrate due to the polarizing properties of the quantum well. As such, the quarternary compound semiconductor buffer is advantageous because the refractive index of the buffer layer 104 is larger than that of the InP substrate 105, and thus, a 3-layer slab waveguide composed of air/buffer layer 104/substrate 105 may be realized in the state of the cap layer 101, the barrier layer 102 and the channel layer 103 being removed using an etching process. Further, a predetermined structure may be formed using a strip line pattern, to manufacture the optical waveguide 118. Hence, light may be freely moved toward desired sites on the substrate without being lost. At this time, light input through the cross-section of the optical waveguide 118 is moved up to the MSM PD according to the arrows of FIG. 3 while forming an optical mode 201 on the optical waveguide 118, and is then absorbed by the portion 115 where the InGaAs channel layer 103 is used as the absorbing layer of the MSM PD. In the case of using the optical waveguide-integrated MSM PD, the PD is a type of waveguide-photodetector, which is superior in operational speed and response properties to general MSM PDs.

Figure 4:
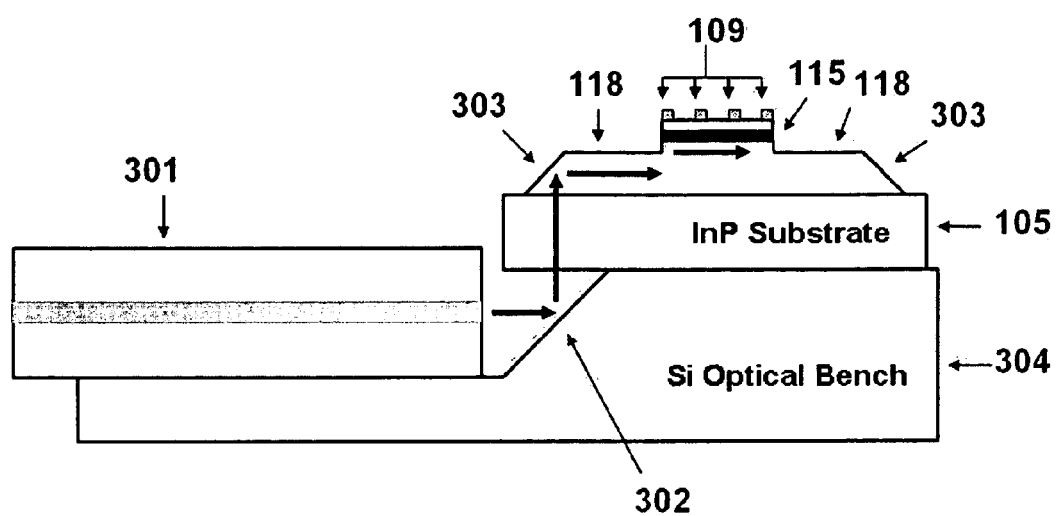
FIGS. 4 and 5 are a sectional view and a top plan view, respectively, showing the optical waveguide-integrated MSM PD of FIGS. 2 and 3, effectively coupled with optical fibers using a silicon substrate as an optical bench.
Figure 5:
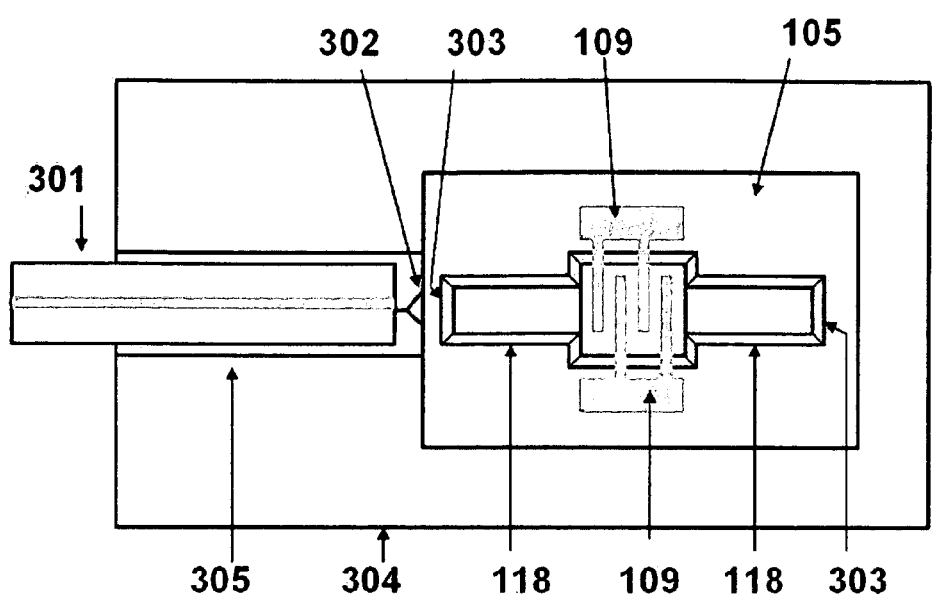

FIGS. 4 and 5 are a sectional view and a top plan view, respectively, of the optical waveguide-integrated MSM PD of FIGS. 2 and 3 which is effectively photocoupled with optical fibers, using a silicon substrate as an optical bench.

As shown in these drawings, a V-groove 305 is formed in a second substrate (silicon substrate) 304, the end of the V-groove 305 being formed into an inclined plane 302 having an inclination angle of 54.74° to a horizontal surface and having a [111] plane. Optical fibers 301 are in the V-groove 305, and the path of light emitted from the optical fibers 301 is changed from a horizontal direction to a vertical direction, using the inclined plane 302 formed at the end of the V-groove 305. This process is generally known in the art, and thus, a description thereof is omitted, provided that the light path in the present invention should be changed again into the horizontal direction to move light toward the optical waveguide 118. To this end, the end of the optical waveguide 118 is formed into an inclined plane 303. As such, the light path corresponds to the arrow shown in FIG. 4. When InGaAsP is used, the angle of the inclined plane 303 is determined depending on the crystal direction and the etching solution. When a mixture comprising $H_2O_2$, $H_3PO_4$ and $H_2O$ or a mixture comprising HBr, $K_2Cr_2O_7$, and $H_3PO_4$ is used, the inclined plane having the angle ranging from 40° to 70° to the surface of the substrate may be formed, regardless of the crystal direction. For photocoupling with optical fibers, the process shown in FIG. 3 is advantageous because a cleavage process (a semiconductor is cleaved according to a specific crystal direction, so that the cleaved cross-section is clean like a mirror) is not needed, and the input area of light is enlarged due to the inclined plane formed at the end of the optical waveguide 118, compared to a butt-couple process.

The method of manufacturing the photoreceiver of the present invention is specifically described below, referring to the above-mentioned drawings.

On a first substrate (InP substrate) 105, a buffer layer 104 formed of a quarternary compound semiconductor, an InGaAs channel layer 103, an InAlAs barrier layer 102 having modulation doping, and an n$^+$-InGaAs cap layer 101 are sequentially laminated and grown, with the use of a thin film manufacturing apparatus using MOCVD (Metal Organic Chemical Vapor Deposition) or MBE (Molecular Beam Epitaxy).

Regions corresponding to an HEMT and a waveguide integrated MSM PD are masked using a photosensitive film pattern, after which unnecessary portions of the buffer layer 104, the channel layer 103, the barrier layer 102 and the cap layer 101 are removed using dry etching or wet drying, to form a mesa corresponding to each of the HEMT and the MSM PD. As such, to etch the InP, a mixture comprising phosphoric acid ($H_3PO_4$) and hydrochloride (HCl) may be used. In addition, to etch the InGaAs, InAlAs and InGaAsP, a mixture comprising phosphoric acid, hydrogen peroxide ($H_2O_2$) and water ($H_2O$), or a mixture comprising sulfuric acid ($H_2SO_4$), hydrogen peroxide and water, may be used. In addition, to form the inclined plane 303 at the end of the optical waveguide 118, a mixture comprising phosphoric acid, potassium bichromate ($K_2Cr_2O_7$), and hydrobromic acid (HBr), having no selectivity to InP, InGaAs, InAlAs or InGaAsP and being able to conduct an etching process regardless of the crystal direction, may be used.

An ohmic contact metal is deposited on the surface of a specific region using a metal evaporator and then the lift-off process is applied, thereby forming a source electrode 106 of the HEMT and a drain electrode 107 of the HEMT. Subsequently, a heat treatment process such as RTA (Rapid Thermal Annealing) is conducted. As such, the ohmic contact metal is composed mainly of laminated metal of AuGe/

Ni/Au, or a highly doped cap layer 101 may be used, if required, to make non-alloyed ohmic contact with the use of laminated metal of Ti/Pt/Au as the ohmic contact metal. In the later case, the RTA process is not required.

To form a gate electrode 108 of the HEMT and a Schottky electrode 109 of the waveguide integrated MSM PD, corresponding regions are defined using a lithography process. The cap layer 101 is selectively removed using wet etching or dry etching. Then, a metal is deposited on the surface of a specific region in the cap layer-removed area by use of a metal evaporator and then the lift-off process is applied, thus forming the gate electrode 108 of the HEMT and the Schottky electrode 109 of the waveguide integrated MSM PD. As such, the used metal is laminated metal of Pt/Ti/Pt/Au to obtain a high Schottky barrier potential.

To form the optical waveguide 118, the regions with the exception of the region corresponding to the optical waveguide 118 are masked using a photosensitive film (at this time, the inclined plane 303 formed at the end of the optical waveguide 118 is masked). Thereafter, the cap layer 101, the barrier layer 102, and the channel layer 103 of the exposed regions, with the exception of the photosensitive film region, are sequentially removed to expose the optical waveguide 118. As such, the etching solution composed of phosphoric acid, hydrogen peroxide and water may be used.

The resultant parts are covered with BCB, a polymer such as polyimide, or a dielectric material such as $SiO_2$ or $Si_3N_4$ for passivation, to protect them.

Additionally, a second substrate (silicon substrate) 304 having a [100] plane is etched using a mixture comprising potassium hydroxide (KOH) and water, to obtain a V-groove 305. As such, when the V-groove 305 is longitudinally arrayed in a [011] direction, the end of the V-groove 305 may be formed into an inclined plane having an inclination angle of 54.74°.

In this way, the HEMT and the waveguide integrated MSM PD can be simultaneously manufactured, as in FIG. 1. Before step 6), a resistor, a connector, and an inductor may be made to realize photoreceiver optoelectronic integrated circuits, which are then mounted to the optical bench obtained through step 7), thereby easily achieving the photo-coupling with optical fibers.

As described above, the present invention provides a method of manufacturing a photoreceiver. According to the method of the present invention, an HEMT and a waveguide integrated MSM PD may be simultaneously manufactured on a single substrate. In addition, since the optical waveguide 118 may be integrated, it may be photocoupled with optical fibers 301, using the V-groove 305 of the silicon optical bench, the inclined plane 302 formed at the end of the V-groove 305, and the inclined plane 303 of the optical waveguide, thus increasing photo-coupling accuracy.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a photoreceiver, comprising:

sequentially laminating a buffer layer, a channel layer, a barrier layer, and a cap layer on a substrate;

forming a mesa for HEMT and MSM PD by removing the buffer layer, the channel layer, the barrier layer, and the cap layer with the exception of a region corresponding to HEMT and MSM PD;

forming a source electrode and a drain electrode of HEMT;

removing the cap layer from a region corresponding to a gate electrode of HEMT and a Schottky electrode of MSM PD;

forming the gate electrode of HEMT and the Schottky electrode of HEMT on the cap layer-removed region; and removing the cap layer, the barrier layer and the channel layer from a region corresponding to an optical waveguide, to expose the optical waveguide.

2. The method according to claim 1, wherein the substrate is an InP substrate.

3. The method according to claim 1, wherein the buffer layer comprises a quaternary compound semiconductor.

4. The method according to claim 3, wherein the quaternary compound semiconductor is InGaAsP ($\lambda \leq 1.3$ μm) or InGaAlAs ($\lambda \leq 1.55$ μm), which is lattice matched to InP.

5. The method according to claim 1, wherein the channel layer is formed of InGaAs.

6. The method according to claim 1, wherein the barrier layer is formed of modulation-doped InAlAs.

7. The method according to claim 1, wherein the cap layer is formed of $n^+$-InGaAs or $n^+$-InP.

8. The method according to claim 1, wherein laminating the buffer layer, the channel layer, the barrier layer and the cap layer is performed using metal organic chemical vapor deposition or molecular beam epitaxy.

9. The method according to claim 1, wherein removing the buffer layer, the channel layer, and the barrier layer and the cap layer with the exception of a region corresponding to HEMT and MSM PD is performed by etching.

10. The method according to claim 1, wherein all of the electrodes are formed of a metal.

11. The method according to claim 1, wherein removing the cap layer from a region corresponding to a gate electrode of HEMT and a Schottky electrode of MSM PD is performed by etching.

12. A method of photocoupling optical fibers to the photoreceiver comprising HEMT and MSM PD manufactured by the method according to claim 1, the method comprising:

forming an end of an optical waveguide connected to MSM PD into an inclined plane;

providing a separate substrate;

forming a V-groove in a portion of the separate substrate in which optical fibers are aligned;

forming a [111] plane in a portion of the separate substrate, which faces an end of the V-groove obliquely; and coupling the photoreceiver to the silicon substrate, to photocouple the optical fibers to MSM PD of the photoreceiver.

13. The method according to claim 12, wherein the separate substrate is a silicon substrate.

14. The method according to claim 12, wherein the [111] plane is inclined at an angle of 54.74°.

* * * * *